United States Patent
Hahn

(10) Patent No.: US 9,958,322 B2
(45) Date of Patent: May 1, 2018

(54) DEVICE FOR PREVENTING INTENSITY REDUCTION OF OPTICAL SIGNAL, OPTICAL EMISSION SPECTROMETER, OPTICAL INSTRUMENT, AND MASS SPECTROMETER INCLUDING THE SAME

(71) Applicant: INDUSTRY-ACADEMIC COOPERATION FOUNDATION YONSEI UNIVERSITY, Seoul (KR)

(72) Inventor: Jae Won Hahn, Seoul (KR)

(73) Assignee: INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 317 days.

(21) Appl. No.: 14/677,300

(22) Filed: Apr. 2, 2015

(65) Prior Publication Data
US 2015/0211924 A1    Jul. 30, 2015

Related U.S. Application Data

(62) Division of application No. 13/293,265, filed on Nov. 10, 2011, now Pat. No. 9,025,143.

(51) Int. Cl.
| | |
|---|---|
| *G01J 3/30* | (2006.01) |
| *G01J 3/02* | (2006.01) |
| *G01J 3/443* | (2006.01) |
| *H01J 49/04* | (2006.01) |
| *H05K 9/00* | (2006.01) |
| *H01J 49/06* | (2006.01) |

(52) U.S. Cl.
CPC .......... *G01J 3/0229* (2013.01); *G01J 3/0286* (2013.01); *G01J 3/443* (2013.01); *H01J 49/0422* (2013.01); *H01J 49/068* (2013.01); *H05K 9/009* (2013.01)

(58) Field of Classification Search
CPC ....... G01N 21/72; G01N 27/62; G01J 3/0286; H05K 9/0086; H05K 9/009; H01J 49/0422; H01J 49/26
See application file for complete search history.

(56) References Cited

U.S. PATENT DOCUMENTS

| | | | | |
|---|---|---|---|---|
| 5,426,299 | A * | 6/1995 | Nakagawa | H01J 49/06 250/281 |
| 5,612,534 | A * | 3/1997 | Mimura | H01J 49/0422 250/281 |
| 6,348,688 | B1 * | 2/2002 | Vestal | H01J 49/004 250/282 |
| 2005/0178975 | A1 * | 8/2005 | Glukhoy | H01J 49/0022 250/427 |

(Continued)

*Primary Examiner* — Kara E Geisel
*Assistant Examiner* — Maurice Smith
(74) *Attorney, Agent, or Firm* — LRK Patent Law Firm

(57) ABSTRACT

A device for a device for preventing the intensity reduction of an optical signal, an optical emission spectrometer, an optical instrument, and a mass spectrometer including the same are provided. The device for preventing the intensity reduction includes a shielding filter which has a mesh structure capable of blocking RF electromagnetic waves radiated from a plasma field for a wafer processing, is installed in the front of an optical window of an optical emission spectrometer for measuring the plasma field from an emission spectrum image of the plasma field, and collects charging particles passing through the mesh.

2 Claims, 11 Drawing Sheets

(56) References Cited

U.S. PATENT DOCUMENTS

2010/0181474 A1* 7/2010 Wang .................. H01J 49/40
250/282
2012/0037799 A1* 2/2012 Sakairi ............... G01N 33/4972
250/288

* cited by examiner

DEVICE FOR PREVENTING INTENSITY REDUCTION OF OPTICAL SIGNAL, OPTICAL EMISSION SPECTROMETER, OPTICAL INSTRUMENT, AND MASS SPECTROMETER INCLUDING THE SAME

CROSS REFERENCE TO RELATED APPLICATION

This application is a division of U.S. patent application Ser. No. 13/293,265, filed Nov. 10, 2011, the disclosure of which is incorporated by reference in its entirety for all purposes.

BACKGROUND

1. Technical Field

The present invention relates to a device for preventing the intensity reduction of an optical signal, an optical emission spectrometer, an optical instrument, and a mass spectrometer including the same.

2. Background Art

In general, in a processing of wafers and the like of semiconductor elements, a plasma process is widely used and particularly, in the processing of DRAM wafers and the like which are expansively used due to universalization of PCs and the like, it is required that wafers having a size of 30 cm are produced at a high yield by the plasma process.

For the processing uniformity of the wafers, it is required that a necessary etching process is exactly progressed by exactly and stably controlling a plasma source and it is more important to exactly control a plasma field generated from the plasma source according to the refinement of wafer patterns.

Accordingly, in order to measure the plasma process used in a semiconductor manufacturing process, various contact measuring techniques such as various optical techniques such as a laser fluorescence spectrometric method, an emission spectrometric method, an absorption spectrometric method, etc., an electric probe, a mass spectrometer, an inductive coupled plasma (ICP), and the like.

However, when the plasma is measured by the optical techniques using the optical emission spectrometer and the like, a measured intensity of the optical signal is reduced due to contamination of a receiving optical window and as a result, the receiving sensitivity of a measuring instrument is lowered, such that it is impossible to measure the plasma in many cases.

Further, even in a device of analyzing components by absorbing gases such as the mass spectrometer, the ICP (inductively coupled plasma), and the optical emission spectrometer, since reactive ions and particles are absorbed to a detector in the absorbing process of the gas, the performance of the detector is deteriorated.

Further, since RF electromagnetic waves, ultrahigh frequencies, and the like are radiated in a plasma generation process or the generated plasma, if the insides of the optical emission spectrometer and the mass spectrometer are exposed by the harmful electromagnetic waves as it is, malfunction of communication equipment may occur, such that in order to solve the problems due to the harmful electromagnetic waves, measures are required.

SUMMARY OF THE DISCLOSURE

The present invention has been made in an effort to provide a device for preventing the intensity reduction of an optical signal capable of efficiently solving problems due to charging particles and harmful electromagnetic waves such as an RF electromagnetic wave which act as contaminants deteriorating measuring sensitivity of an optical emission spectrometer, an optical instrument, a mass spectrometer, and an optical emission spectrometer, an optical instrument, and a mass spectrometer including the same.

An exemplary embodiment of the present invention provides a device for preventing the intensity reduction of an optical signal including a shielding filter which has a mesh structure capable of blocking RF electromagnetic waves radiated from a plasma field for a wafer processing, is installed in the front of an optical window of an optical emission spectrometer for measuring the plasma field from an emission spectrum image of the plasma field, and collects charging particles passing through the mesh.

One shielding filter may have an extension surface in a vertical direction to input and inflow paths of a plasma emission spectrum.

A plurality of shielding filters having an extension surface in a vertical direction to input and inflow paths of the plasma emission spectrum may be continuously arranged according to the input and inflow paths of the plasma emission spectrum.

The plurality of shielding filters may include hollow parts and crossing parts of the mesh having the same phase as each other.

The plurality of shielding filters may include hollow parts and crossing parts of the mesh having different phases from each other.

The plurality of shielding filters may have extension directions of linear elements configuring the mesh which are disposed to be different from each other.

The plurality of shielding filters may have a regular phase difference according to the extension direction of the linear element configuring the mesh.

The plurality of shielding filters may have mesh structures having different densities.

The device for preventing the intensity reduction of an optical signal may further include a fixation frame which has a shape corresponding to a circumference of the shielding filter, is connected to the shielding filter, and assembled to the front end of the optical window of the optical emission spectrometer.

Insertion grooves into which the shielding filter is inserted and fixed may be formed at the inner portion of the fixation frame.

The fixation frame may be contact-connected to one-side circumference of the shielding filter to restrict the shielding filter or pressurized toward the front end of the optical emission spectrometer.

The device for preventing the intensity reduction of an optical signal may further include an insertion ring inserted between the front end of the optical emission spectrometer and the shielding filter and/or between the shielding filters with a spaced interval.

The insertion ring may be made of an elastic member.

Another exemplary embodiment of the present invention provides an optical emission spectrometer for measuring plasma including: a shielding filter which has a mesh structure capable of blocking RF electromagnetic waves radiated from a plasma field for a wafer processing, is installed in the front of an optical window into which an emission spectrum of the plasma field is inputted, and collects charging particles passing through the mesh; an optical system main body including a receiving lens receiving the plasma emission spectrum passing through the shielding filter, an aperture determining a size of the optical signal inputted to and/or outputted from the receiving lens, and a pinhole limiting the depth of focus of the optical signal passing through the receiving lens; and an analyzer analyzing emission spectrum image of the plasma field by receiving the optical signal passing through the aperture and the pinhole from the optical system main body.

The optical emission spectrometer for measuring plasma may further include a protection window made of a transparent material and disposed between the receiving lens and the shielding filter.

The optical emission spectrometer for measuring plasma may further include a laser device irradiate a laser in a proceeding direction and an opposed direction of the optical signal in the optical system main body so that the receiving lens, the aperture, and the pinhole are aligned and controlled therebetween by matching a collecting position of the laser light and a measuring position of the plasma field.

Another exemplary embodiment of the present invention provides an optical instrument including: a shielding filter which has a mesh structure capable of blocking RF electromagnetic waves radiated from a plasma field for a wafer processing, is installed in the front of an optical window into which an emission spectrum of the plasma field is inputted, and collects charging particles passing through the mesh; a lens receiving a plasma emission spectrum passing through the shielding filter; and a light processing device making an image of an object or measuring physical parameters by reflecting, refracting, interfering, diffracting, and/or polarizing the optical signal passing through the lens.

Another exemplary embodiment of the present invention provides a mass spectrometer including: a shielding filter which has a mesh structure capable of blocking an RF electromagnetic wave radiated in a plasma field for a wafer processing and is installed in the front of an inlet of the analyzed gas to collecting the charging particles passing through the mesh; an ionizer ionizing and accelerating the analyzed gas; a separator separating ions accelerated by passing, through the ionizer according to a mass; and a detector detecting and measuring the separated ions through the separator.

Another exemplary embodiment of the present invention provides a device for preventing the intensity reduction of an optical signal including a plurality of positive electrode plates and negative electrode plates having concentric holes formed at the center thereof and alternately arranged so as to overlap with each other to collect charging particles passing through the holes.

The positive electrode plate and the negative electrode plate may be insulated from each other by a nonconductor and in order to prevent the positive electrode plate and the negative electrode plate from being current-conducted with each other by the contamination of the nonconductor surface due to the charging particles, the nonconductor may be configured by i) an insulation part inserted between the positive electrode plate and the negative electrode plate, ii) an anti-contamination part formed to be spaced apart from the positive electrode plate and the negative electrode plate with a regular interval, and iii) a connection part connecting the insulation part and the anti-contamination part.

The electrode plate array may be insulated from an external body by the nonconductor.

Another exemplary embodiment of the present invention provides an optical emission spectrometer including: i) a device for preventing the intensity reduction of an optical signal including a plurality of positive electrode plates and negative electrode plates having concentric holes formed at the center thereof and alternately arranged so as to overlap with each other to collect charging particles passing through the holes; ii) an optical system body including a receiving lens into which the optical signal passing through the device for preventing the intensity reduction of the optical signal flows, a pinhole on which an image of the optical signal passing through the receiving lens is focused, an aperture installed between the pinhole and the receiving lens to determine a receiving angle, and a transfer optical system transferring the optical signal passing through the pinhole; iii) an optical fiber transferring the optical signal passing through the optical system body to the analyzer; and iv) a spectrum analyzer analyzing the optical signal collected through the optical fiber.

Sizes of inner concentric circles formed at the positive electrode plate and the negative electrode plate configuring the device for preventing the intensity reduction of an optical signal may be determined according a receiving angle of the light, the positive electrode plate and the negative electrode plate may be black-colored or black-processed with a conductive material in order to prevent the scattering of light, and a protection window disposed in the front of the receiving lens is separately formed at the device for preventing the intensity reduction of an optical signal in order to prevent the contamination of the receiving lens.

The optical emission spectrometer may further include a laser device connected to the optical fiber and the measuring position and the lens may be aligned by matching a collected position of the laser light emitted from the laser device and a position of a measuring target.

Another exemplary embodiment of the present invention provides a mass spectrometer including: i) a device for preventing the intensity reduction of an optical signal of an analyzed sample including a plurality of positive electrode plates and negative electrode plates having concentric holes formed at the center thereof and alternately arranged so as to overlap with each other to collect charging particles passing through the holes; ii) an ionizer ionizing and accelerating the analyzed sample; iii) a separator separating accelerated ions according to a mass; and iv) a detector detecting and measuring the separated ions.

According to exemplary embodiments of the present invention, since a shielding filter having a mesh structure capable of collecting charging particles is installed in the front of an optical window of an optical instrument such as an optical emission spectrometer, a camera, and the like into which an optical signal or analyzed gas is inputted and flows or an inlet of a mass spectrometer, it is possible to prevent the deterioration in a measurement due to contamination particles, generation of an analysis error, and performance.

Further, since the charging particles such as ions, ion adherent matters, and the like additionally generated in a plasma process and the like are collected and removed in the shielding filter, it is possible to prevent the contamination of an optical window of the optical instrument due to attachment of the charging particles and prevent the contamination of a measuring instrument by collecting the charging particles in gas flowing into an analyzer.

Further, the shielding filter having the mesh structure can be fabricated and easily implemented by a simple assembling in which the shielding filter is installed in the front of various contact and contactless measuring instruments and analyzers for measuring an immaterial thing such as an optical signal (light, heat, and the like) or analyzing a material thing (atoms, molecules, and the like) configuring the gas.

Further, if the shielding filter is made of a conductive material such as a metallic material, a conductive polymer, and the like, the shielding filter may be configured by electrodes having predetermined voltage by connecting the shielding filter with an electrode terminal of a power connection device. In addition, when the shielding filter is configured as an electrode structure, although a separate constituent element such as the power connection device is not included, the shielding filter may be configured by a ground electrode by current-conduction with the outside.

Further, when the shielding filter is made of the conductive material such as a metallic material, a conductive polymer, and the like, an RF high-frequency electromagnetic wave contacted to the mesh in a process of passing through the shielding filter is absorbed into the shielding filter, such that an inflow thereof may also be blocked. Accordingly, it is possible to solve malfunction of electronic communication equipment related to the optical instruments such as the optical emission spectrometer and the mass spectrometer due to the harmful electromagnetic waves such as an RF electromagnetic wave, a superhigh frequency which are radiated from a plasma generating process or the generated plasma.

Further, since the optical signal or analyzed gas passes through the plurality of positive electrode plates and negative electrode plates which have concentric holes formed at the center thereof and are alternately arranged so as to overlap with each other, the charging particles generated in the plasma process and the like are collected, such that it is possible to prevent the intensity of the optical signal from being reduced.

DETAILED DESCRIPTION

Hereinafter, exemplary embodiments of the present invention will be described below with reference to the accompanying drawings.

Figure 1:
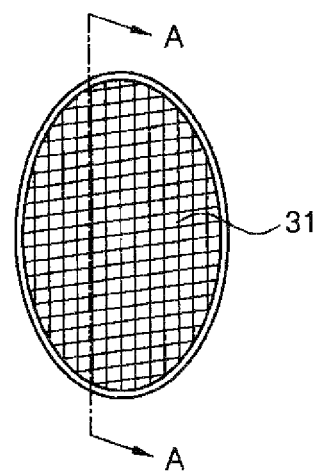
FIG. 1 is a perspective view showing a shielding filter of a device for preventing the intensity reduction of an optical signal according to a first exemplary embodiment of the present invention.
Figure 2:
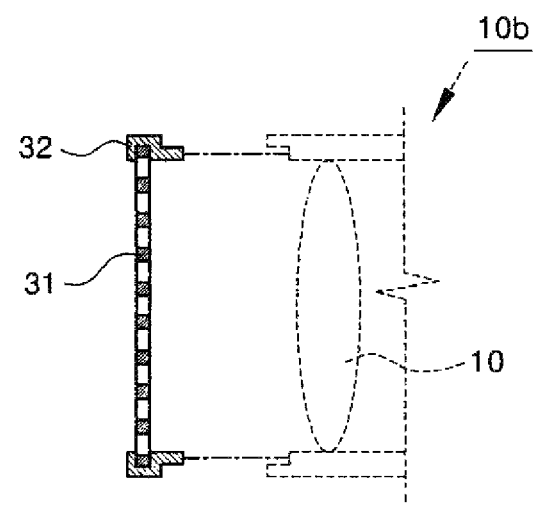
FIG. 2 is a cross-sectional view showing a first example of a fixation frame for assembling the shielding filter of FIG. 1 to a front end of an optical window of an optical instrument.
Figure 3:
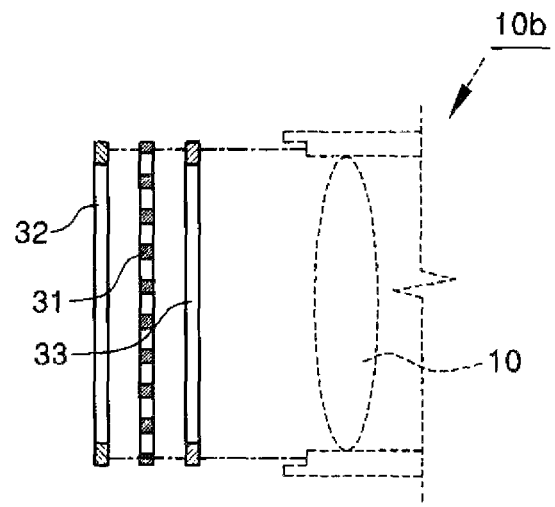
FIG. 3 is a cross-sectional view showing a second example of a fixation frame for assembling the shielding filter of FIG. 1 to a front end of an optical window of an optical instrument.

FIG. 1 is a perspective view showing a shielding filter of a device for preventing the intensity reduction of an optical signal according to a first exemplary embodiment of the present invention and FIGS. 2 and 3 are cross-sectional views showing first and second examples of a fixation frame together with a cross-section of line A-A of FIG. 1, respectively.

Referring to FIGS. 1 to 3, a device for prevention the intensity reduction of an optical signal according to an exemplary embodiment of the present invention includes a shielding filter 31 having a mesh structure capable of collecting charging particles floating on a path of an emission spectrum (hereinafter, used together with an 'optical signal') of a plasma field while blocking a RF electromagnetic wave radiated in the plasma field.

The shielding filter 31 is installed in the front of optical windows of a specific optical instrument such as an optical emission spectrometer 10a (see FIG. 13) into which the optical signal is inputted or an analyzed gas flows and a general optical instrument such as a camera 40 (see FIG. 14) or the mass spectrometer (see FIG. 15) so as to prevent the charging particles mixed in the optical signal or the analyzed gas from entering the optical windows of the optical emission spectrometer 10a and the optical instrument 10b or the mass spectrometer 20a.

Hereinafter, the specific optical instrument such as an optical emission spectrometer 10a (see FIG. 13) and the general optical instrument such as a camera 40 (see FIG. 14) are called the optical instrument 10b.

When the shielding filter 31 includes electrodes having an opposite polarity to the charging particles, the charging particles mixed in the optical signal or the analyzed gas are separated from the optical signal or the analyzed gas by an electrostatic force of the shielding filter 31 to be attached and held to the shielding filter 31.

A constituent material thereof such as a metal material, polymer, and the like is not particularly limited if the charging particles can be attached, but if the shielding filter 31 is made of a conductive material such as a metal material, a conductive polymer, and the like, the shielding filter 31 may be configured by an electrode having predetermined voltage by connecting the shielding filter 31 to an electrode terminal of a power connecting device. In addition, although the shielding filter 31 is configured as the electrode structure without a separate constituent element such as the power connecting device, the shielding filter 31 may be configured as a ground electrode by connecting with the outside.

Further, when the shielding filter 31 is made of the conductive material such as a metal material, a conductive polymer, and the like, the RF high-frequency electromagnetic wave contacted to the mesh when passing through the shielding filter 31 is absorbed into the shielding filter 31 such that an inflow thereof may also be blocked. Accordingly, it is possible to solve malfunction of electronic communication equipment related to the optical instruments such as the optical emission spectrometer and the mass spectrometer due to the harmful electromagnetic waves such as an RF electromagnetic wave, a superhigh frequency which are radiated from, a plasma generating process or the generated plasma.

As described above, when the shielding filter 31 shields the high-frequency electromagnetic wave and simultaneously, implements a collecting function of the charging particles, neutral particles having a larger size than a hollow of the mesh configuring the shielding filter 31 other than the charging particle may be collected.

Referring to FIG. 1, in the first exemplary embodiment of the present invention, the shielding filter 31 has a net shape having a flat extension surface in a vertical direction to the input or inflow path of the optical signal or analyzed gas.

The net-shaped shielding filter 31 may be directly installed on the front end of the optical window of the optical instrument 10b or the mass spectrometer 20a, but as show in FIGS. 2 and 3, the shielding filter 31 may be more firmly and easily attached and assembled by using a fixation frame 32.

One side of the fixation frame 32 has a shape corresponding to a circumference of the shielding filter 31, the other side thereof has a shape corresponding to the front end of the optical window of the optical instrument 10b or the mass spectrometer 20a, and both one side and the other side of the fixation frame 32 are assembled and installed so as to be contacted to the shielding filter 31 and the front end of the optical window of the optical instrument 10b or the mass spectrometer 20a.

The first example of the fixation frame 32 shown in FIG. 2 has a structure with an insertion groove (not shown) which can be fixed by inserting the circumference of the shielding filter 31 on one side (an inner side in FIG. 2) of the fixation frame 32.

The second example of the fixation frame 32 shown in FIG. 3 has a flat ring shape, one side (a left side of FIG. 3) of the fixation frame 32 is contactually connected to one circumference of the shielding filter 31 to put the shielding filter 31 between the front end of the optical window of the optical instrument 10b or the mass spectrometer 20a or be pressurized to the optical window of the optical instrument 10b or the mass spectrometer 20a.

The front end of the optical instrument 10b or the mass spectrometer 20a and the shielding filter 31 may be directly contacted to each other, but in order to prevent the damage due to the direct contact with the shielding filter 31 and control a installation distance, an insertion ring 33 may be inserted between the optical instrument 10b or the front end of the mass spectrometer 20a and the shielding filter 31.

When the insertion ring 33 is configured by an elastic member, a flowable separated distance is formed between the front end of the optical instrument 10b or the mass spectrometer 20a and the shielding filter 31, such that a defective assembly due to an assembly error and a manufacturing error between the shielding filter 31 and the front end of the optical instrument 10b or the mass spectrometer 20a may be compensated and vibration, impact, and the like in the assembling and using processes may be shock-absorbed and attenuated.

When the shielding filter 31 is configured by the electrode having the specific voltage, the fixation frame 32 may be configured by a nonconductor which can insulate the shielding filter 31 from the outside. When the shielding filter 31 is configured by the ground electrode, the fixation frame 32 may be connected with an external ground element device (e.g., a reactor of plasma and the like).

Figure 4:
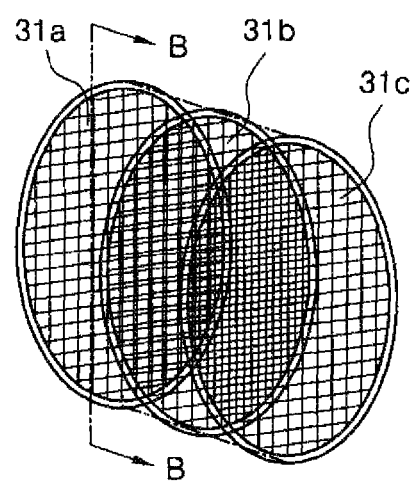
FIG. 4 is a perspective view showing a shielding filter of a device for preventing the intensity reduction of an optical signal according to a second exemplary embodiment of the present invention.
Figure 5:
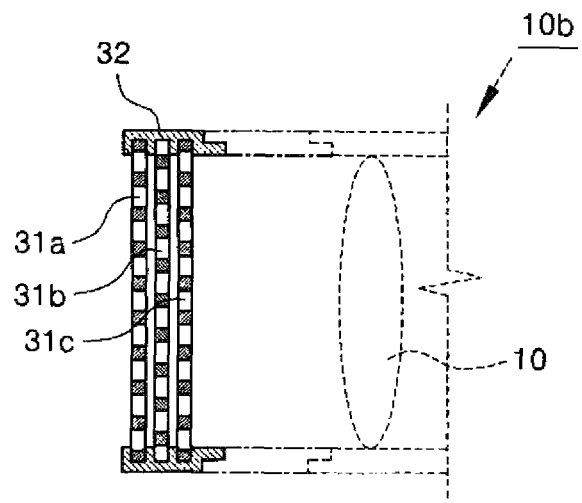
FIG. 5 is a cross-sectional view showing a third example of a fixation frame for assembling the shielding filter of FIG. 4 to a front end of an optical window of an optical instrument.
Figure 6:
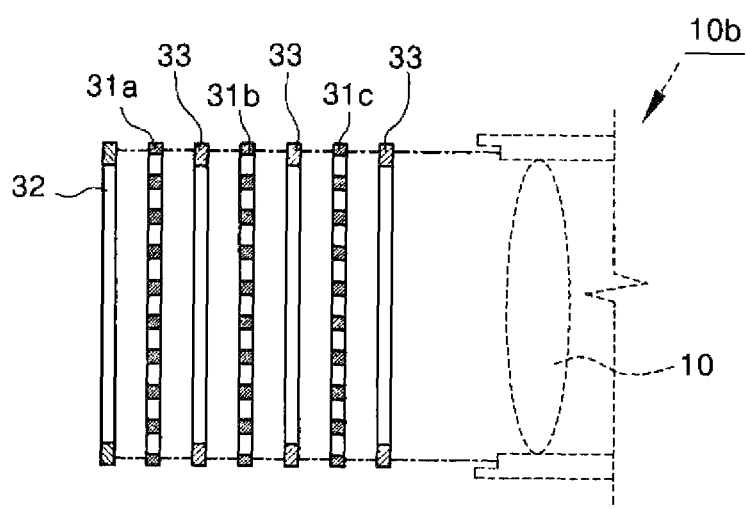
FIG. 6 is a cross-sectional view showing a fourth example of a fixation frame for assembling the shielding filter of FIG. 4 to a front end of an optical window of an optical instrument.
Figure 7:
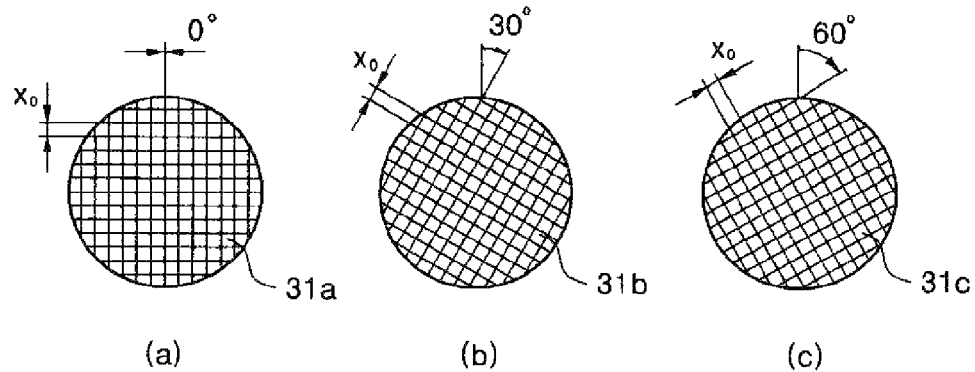
FIG. 7 is a conceptual diagram showing a first example of an arrangement structure of a shielding filter.
Figure 8:
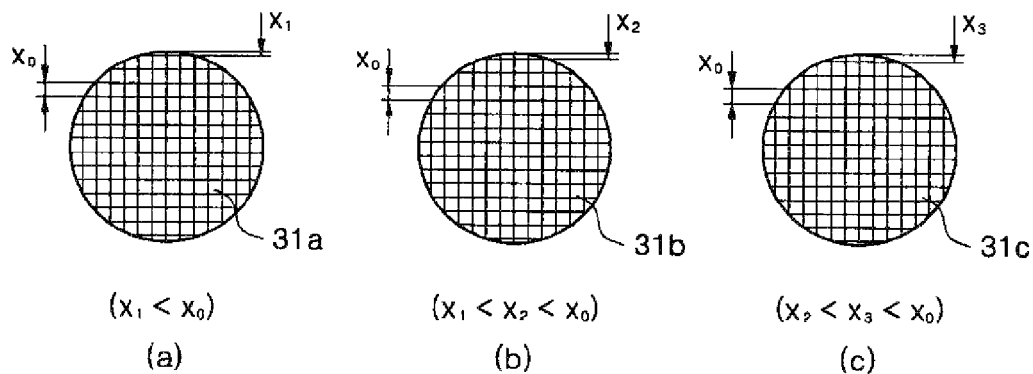
FIG. 8 is a conceptual diagram showing a second example of an arrangement structure of a shielding filter.
Figure 9:
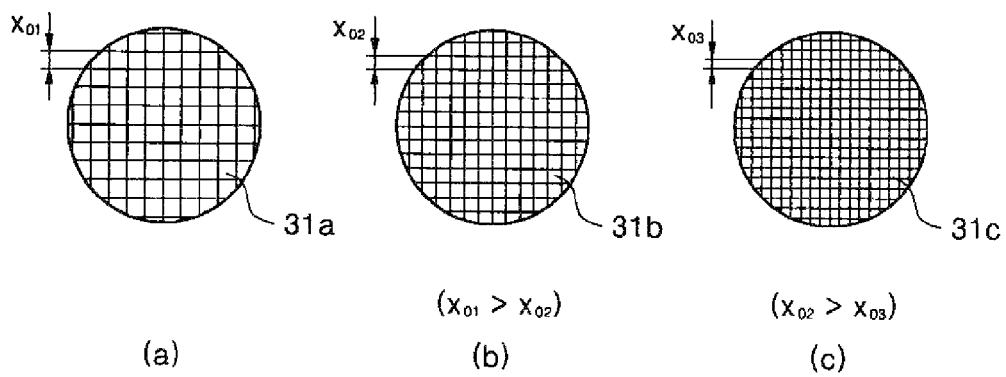
FIG. 9 is a conceptual diagram showing a third example of an arrangement structure of a shielding filter.

FIG. 4 is a perspective view showing a shielding filter of a device for preventing the intensity reduction of an optical signal according to a second exemplary embodiment of the present invention, FIGS. 5 and 6 are cross-sectional views of third and fourth examples of a fixation frame together with a cross-section of line B-B of FIG. 4, respectively, and FIGS. 7 to 9 are conceptual diagrams showing first, second, and third examples of an arrangement structure of a shielding filter, respectively.

Referring to FIGS. 4 to 6, a plurality of shielding filters 31 according to the second exemplary embodiment of the present invention which have an extension surface in a vertical direction to the input or inflow path of the optical signal or analyzed gas are continuously disposed according to the input or inflow path of the optical signal or analyzed gas, as compared with the shielding filters 31 according to the first exemplary embodiment shown in FIGS. 1 to 3.

Hereinafter, when the plurality of shielding filters 31 are provided, for convenience of the description, a shielding filter 31a, a shielding filter 31b, and a shielding filter 31c are sequentially disposed from the shielding filters 31 disposed at the foremost end.

The plurality of shielding filters 31a, 31b, and 31c may be installed at the front end of the optical window of the optical instrument 10b or the mass spectrometer 20a while a plurality of insertion grooves (not shown) which are formed to be separated from each other at the inner circumference are assembled on the fixation frame 32, as shown in FIG. 5.

Further, a front end circumference of the shielding filter 31a which is disposed at the foremost end of the plurality of shielding filters 31a, 31b, and 31c is contacted to the fixation frame 32 having the flat ring shape, as shown in FIG. 6 and the insertion ring 33 may be inserted and contacted between the shielding filters 31a, 31b, and 31c and between the optical instrument 10b or the mass spectrometer 20a and the shielding filter 31.

When the plurality of shielding, filters 31a, 31b, and 31c are continuously disposed, a plurality of hollow parts and crossing parts of the mesh may be disposed at the same phase as each other and the plurality of hollow parts and crossing parts of the mesh may be disposed at different phases from each other.

When the plurality of shielding filters 31a, 31b, and 31c are disposed, although the RF electromagnetic waves or the charging particles are not contacted with or collected in the shielding filter 31a disposed at the foremost end, the electromagnetic waves or the charging particles may be contacted with or collected in the shielding filters 31b and 31c when sequentially passing through the shielding filters 31b and 31c in multi-stepwise.

As shown in FIGS. 7 to 9, when the plurality of shielding filters 31a, 31b, and 31c including the hollow parts and the crossing parts of the mesh having different phases are disposed, although the charging particles move to a linear path without a phase change in a horizontal direction, any one of the plurality of shielding filters 31a, 31b, and 31c may be collected when passing through the plurality of shielding filters 31a, 31b, and 31c.

As shown in FIGS. 7A to 7C, each of the shielding filters 31a, 31b, and 31c may be disposed so as to have different extension directions of linear elements configuring the mesh (0°, 30°, or 60° in FIG. 7) and the plurality of shielding filters having the same mesh structure may be disposed at different angles.

Further, as shown in FIGS. 8A to 8C, the shielding filters 31a, 31b, and 31c may be disposed so as to have a phase between the extension directions (vertical directions or horizontal directions) of the linear elements configuring the mesh (in FIG. 8, distance x1 between upper end of shielding filter 31a and the first column<distance x2 between upper end of shielding filter 31b and the first column<distance x3 between upper end of shielding filter 31c and the first column<mesh distance x0).

Further, as shown in FIGS. 9A to 9C, the plurality of shielding filters 31a, 31b, and 31c may have mesh structures having different densities, and the charging particles larger than the mesh distance of the shielding filter 31a are collected in the shielding filter 31a and the charging particles smaller than the mesh distance may be separately collected in the shielding filter 31b or shielding filter 31c according to the size thereof (in FIG. 9, mesh distance x01 of shielding filter 31a<mesh distance x02 of shielding filter 31b<mesh distance x03 of shielding filter 31c).

Figure 10:
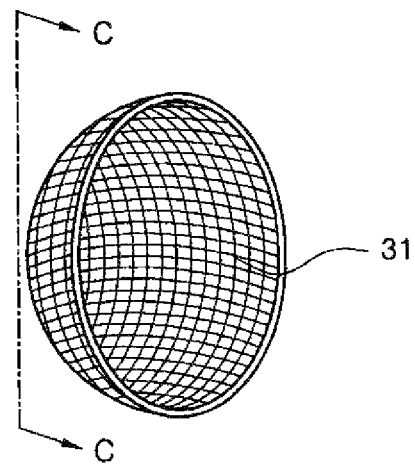
FIG. 10 is a perspective view showing a shielding filter of a device for preventing the intensity reduction of an optical signal according to a third exemplary embodiment of the present invention.
Figure 11:
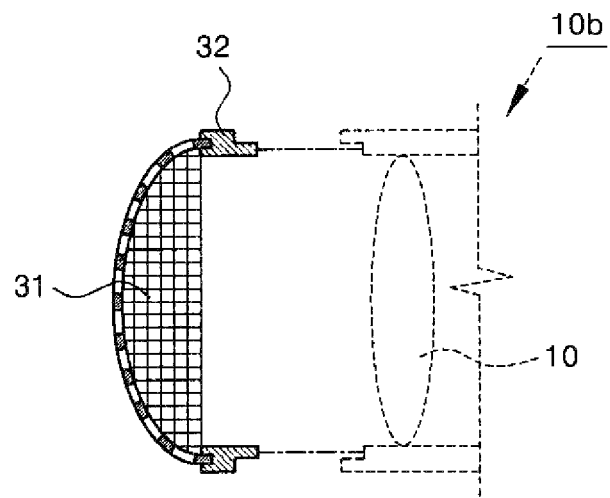
FIG. 11 is a cross-sectional view showing a fifth example of a fixation frame for assembling the shielding filter of FIG. 10 to a front end of an optical window of an optical instrument.
Figure 12:
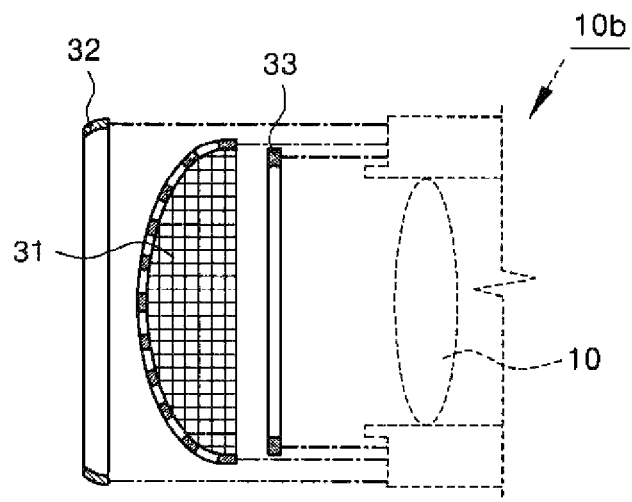
FIG. 12 is a cross-sectional view showing a sixth example of a fixation frame for assembling the shielding filter of FIG. 10 to a front end of an optical window of an optical instrument.

FIG. 10 is a perspective view showing a shielding filter configured by a mesh having a curvature of a device for preventing the intensity reduction of an optical signal according to a third exemplary embodiment of the present invention and FIGS. 11 and 12 are cross-sectional views showing fifth and sixth examples of a fixation frame together with a cross-section of line C-C of FIG. 10, respectively.

The shielding filter 31 may have a 3-dimensional stereoscopic shape, not a 2-dimensional planar shape and referring to FIGS. 10 to 12, the shielding filter 31 according to the third exemplary embodiment of the present invention has a convex dome shape which can easily check a collecting degree of the charging particles from the outside and easily deviate and remove the charging particles from the shielding filter 31 due to the force of gravity.

The shielding filter 31 may be installed at the front end of the optical window of the optical instrument 10b or the mass spectrometer 20a while a plurality of circular insertion grooves (not shown) which are continuously formed at the front end circumference are assembled on the fixation frame 32, as shown in FIG. 11.

Further, as shown in FIG. 12, circumferences of the outer and inner side ends of the shielding filter 31 are contacted to an inner part of the fixation frame 32 having a curved surface corresponding to an outer surface of a rear end of the shielding filter 31a and an outer part of the insertion ring 33 inserted between the optical instrument 10b or the mass spectrometer 20a and the shielding filter 31.

Figure 13:
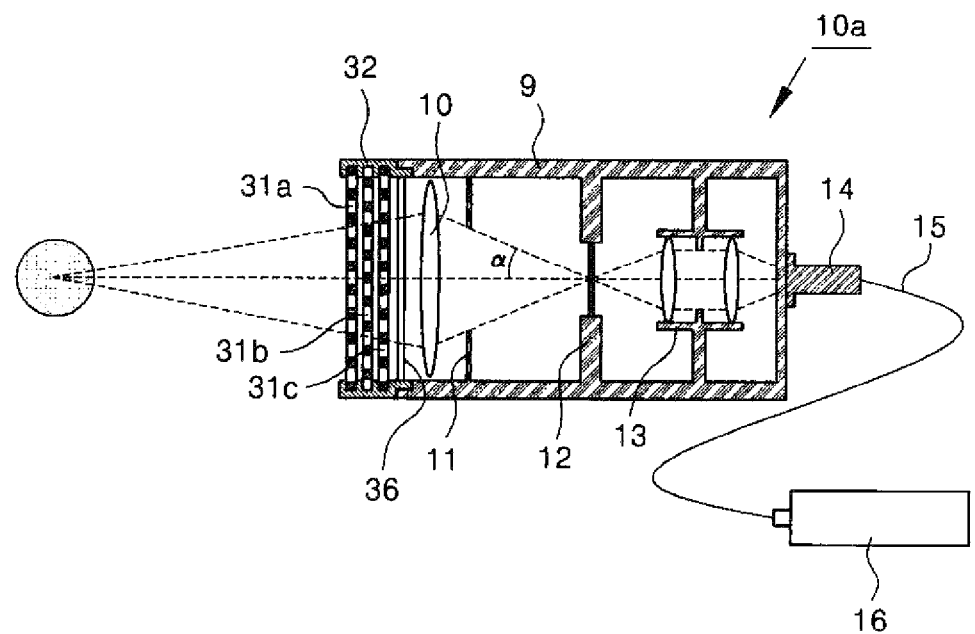
FIG. 13 is a cross-sectional view of an optical emission spectrometer according to the first exemplary embodiment of the present invention.

FIG. 13 is a cross-sectional view of an optical emission spectrometer according to the first exemplary embodiment of the present invention.

Referring to FIG. 13, the optical emission spectrometer 10a according to the first exemplary embodiment of the present invention includes the shielding filter 31, an optical system main body (not shown) configured by a receiving lens 10, a pinhole 12, an aperture 11, and a transfer optical system 13 in order to analyze an emission spectrum of a plasma field for a wafer processing, and an analyzer 16.

The charging particles dispersing and flowing on the optical signal path and the RF high-frequency electromagnetic wave proceeding toward the receiving lens 10 are collected and blocked by the shielding filter 31 disposed in the front of the optical window (the receiving lens 10 in FIG. 13) and the optical signal passes through the shielding filter 31 to be inputted to the receiving lens 10.

The aperture 11 is disposed in the front and/or rear of the receiving lens 10 to determine a magnitude (or a receiving angle α) of a plasma emission spectrum (optical signal) inputted to and/or outputted from the receiving lens 10. If the aperture 11 is disposed in the front of the receiving lens 10, an out-focused portion of the optical signal inputted to the receiving lens 10 is blocked and if the aperture 11 is disposed in the front of the receiving lens 10 an in-focused portion of the optical signal outputted from the receiving lens 10 is blocked.

The pinhole 12 is disposed at a point where the image of the optical signal passing through the receiving lens 10 is focused to limit the depth of focus of the optical signal passing through the receiving lens 10 and improve the resolution and the transfer optical system 13 transfers the optical signal passing through the receiving lens 10, the aperture 11, and the pinhole 12 to the outside.

The optical signal delivered to the transfer optical system 13 is transferred to the analyzer 16 by an optical fiber 15 and the like and the analyzer 16 analyzes the emission spectrum (optical signal) of the plasma field transferred through the optical fiber 15.

While a measuring distance of the plasma field is changed by controlling a position of the receiving lens 10 having the above structure, the front and rear apertures 11, and the pinhole 12, the intensity distribution of light having the spatial resolution may be measured.

If the surface of the shielding filter 31 is colored with black or processed with a black pigment, in which an anti-scattering function of light is implemented, the distortion of the optical signal due to the shielding filter 31 may be prevented.

When a protection window 36 made of a transparent material is installed between the receiving lens 10 and the shielding filter 31, contamination particles collected in the shielding filter 31 is removed by the protection window 36 or the contamination particles of the shielding filter 31 moves toward the receiving lens 10 in a process of replacing the shielding filter 31, such that it is possible to prevent the contamination. When the fixation frame 32 is included, the protection window 36 may be integrally assembled with the shielding filter 31 by the exemplary embodiment in which the insertion groove is inserted into the fixation frame 32.

Meanwhile, when the shielding filter 31 is attached to the front of the optical system main body, by an optical effect due to the shielding filter 31 or a viewing angle limit of the optical emission spectrometer 10a due to the fixation frame 32, the insertion ring 33, and the like, it is difficult to arrange inner devices such as the receiving lens 10 and the aperture 11 based on the plasma measuring point. The problem may be solved by connecting, a laser device (replaced with the analyzer 16 or included in the analyzer 16 in FIG. 13) from which laser light is inputted to the optical fiber 15.

The laser device irradiates the laser in a proceeding direction and an opposed direction of the optical signal in the optical system main body, such that a measuring position and the inner devices including the receiving lens 10 and aperture 11 may be arranged and controlled by matching a collecting position of the laser light and the plasma measuring position.

If the laser light emitted from the laser device is inputted into the optical system main body through the optical fiber 15 and a fiber connector 14 which connects the optical fiber 15 on the light path of the optical system main body, the laser light is irradiated in the front of the optical system main body to be collected on an object of the front thereof, such that inner constituent elements of the optical system main body may be arranged by matching the collecting position of the laser light emitted through the optical system main body and the plasma measuring point.

Figure 14:
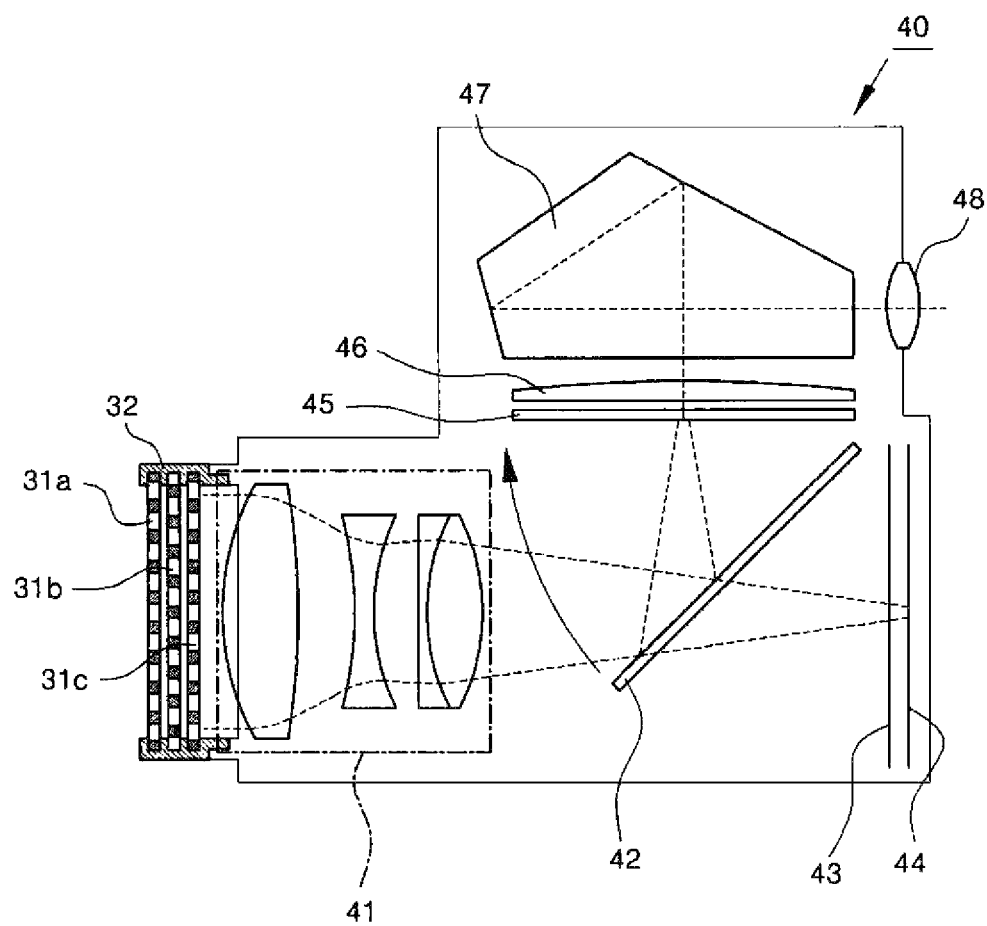
FIG. 14 is a cross-sectional view of a single-lens reflex according to the first exemplary embodiment of the present invention.

FIG. 14 is a cross-sectional view of a single-lens reflex according to the first exemplary embodiment of the present invention.

Hereinafter, the specific optical instrument such as an optical emission spectrometer 10a (see FIG. 13) and the general optical instrument such as a camera 40 (see FIG. 14) are called the optical instrument 10b and an exemplary embodiment in which the shielding filter 31 is applied to a single-lens reflex representing a camera shown in FIG. 14 will be described.

The single-lens reflex (SLR) is called a camera which projects an image on a mate focus screen by using a mirror installed between the lens and a film and most single-lens reflexes are installed with a roof pentaprism or a pentamirror for refracting the light on the upper portion to focus the image passing through the lens on a view finder. In addition, a waist-level finder or a porro prism is used.

Referring to FIG. 14, the camera 40 according to the first exemplary embodiment of the present invention includes the shielding filter 31, a lens part 41, a mirror 42, a shutter 43, a sensor or film 44, a focus screen 45, a compression lens 46, a pentaprism 47, and an eyepiece 48.

The charging particles dispersing and flowing on a path of image information (optical signal) inputted to the lens part 41 of the camera have a mesh structure collecting the charging particles and is collected by the shielding filter 31 installed in the front of the optical window (the lens part 41 in FIG. 14), such that the image information (optical signal) is inputted to the lens part 41 by passing through the shielding filter 31.

In non-photographing, the image information (optical signal) inputted through the lens part 41 is reflected in the mirror 42 to be focused and projected on the focus screen 45 and the image information passing through the compression lens 46 is reflected in the inside of the pentaprism 47 to be delivered to the eyepiece 48.

In photographing, the mirror 42 goes up in an arrow direction and the shutter (focal plane shutter) 43 opens to be projected on the sensor or film 44. There is no viewing difference between the image focused on the focus screen 45 and the image focused on the sensor or film 44.

Figure 15:
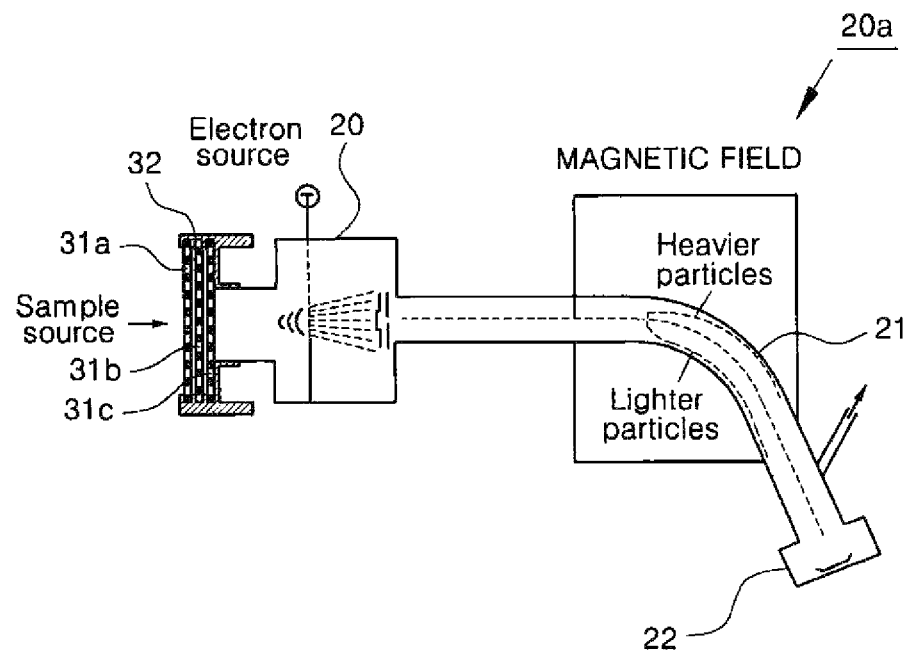
FIG. 15 is a cross-sectional view of a-mass spectrometer according to the first exemplary embodiment of the present invention.

Referring to FIGS. 14 and 15, the optical instrument 10b according to the exemplary embodiment of the present invention may include the shielding filter 31 installed in the front of the optical window into which the optical signal is inputted, a lens in which the optical signal passing through the shielding filter 31 is inputted, a light processing device making an image of an object or measuring physical parameters by reflecting, refracting, interfering, diffracting, and/or polarizing the optical signal inputted through the lens.

FIG. 15 is a cross-sectional view of a mass spectrometer according to the first exemplary embodiment of the present invention.

Referring to FIG. 15, a mass spectrometer 20a according to the first exemplary embodiment of the present invention includes the shielding filter 31, an ionizer 20, a separator 21, and a detector 22.

The shielding filter 31 has a mesh structure which can block an RF electromagnetic wave radiated in a plasma field for a wafer processing like the case where the shielding filter 31 is applied to the optical instrument 10b and is installed in the front of an inlet of the analyzed gas to collecting the charging particles passing through the mesh.

The charging particles dispersing and flowing on an inflow path of the analyzed gas and the RF high-frequency electromagnetic wave radiated during the plasma process are collected and blocked by the shielding filter 31 installed in the front of the inlet of the ionizer 20 into which the analyzed gas flows.

The analyzed gas in which the charging particles are removed by passing through the shielding filter 31 flows into the inlet of the ionizer 20 to be ionized and accelerate, the separator 21 separates the ions accelerating by passing through the ionizer 20 according to a mass, and the detector 22 detects and measures the ions separated through the separator 21.

Figure 16:
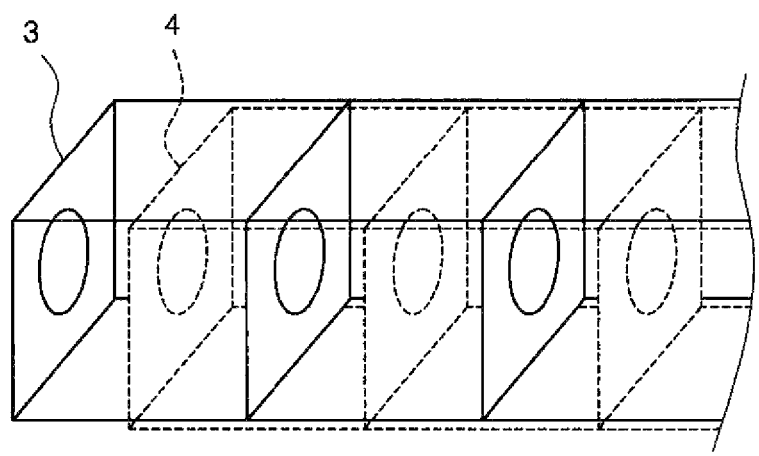
FIG. 16 is a perspective view showing an electrode plate array configuring a device for preventing the intensity reduction of an optical signal according to another exemplary embodiment of the present invention.

As shown in FIG. 16, a device for preventing the intensity reduction of an optical signal according to another exemplary embodiment of the present invention is configured by a plurality of positive electrode plates 3 and negative electrode plates 4 which have concentric holes formed at the center thereof and are alternately arranged so as to overlap with each other and the alternately arranged electrode plates collect the charging particles passing through the concentric holes.

Voltage applied to the electrode plate is determined by considering a kind of the charging particles and peripheral voltage and may be several volts to several tens volts in a general semiconductor plasma process. When considering in that a pressure of the general plasma process is several mTorr to several tens mTorr, the effect that tens of thousands times voltage is applied in an air pressure may be achieved.

The positive electrode plate 3 and the negative electrode plate 4 may be insulated from each other by the nonconductor 2, the electrode plate array may be insulated from each other by using an external metallic main body 1 and an insulator 5, and the external main body may be grounded to be connected with a reactor of the plasma and the like.

Figure 17:
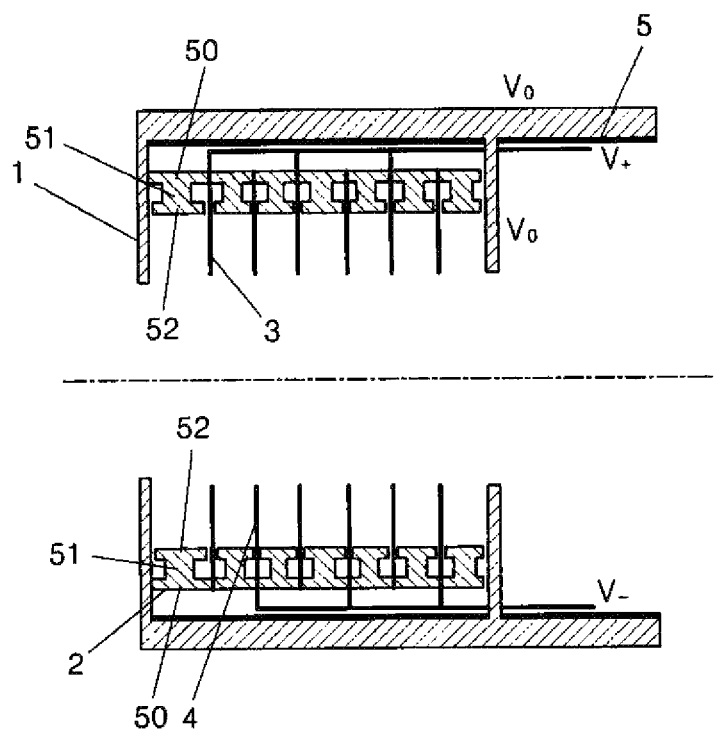
FIGS. 17 and 18 are cross-sectional views of a device for preventing the intensity reduction of an optical signal insulated with a nonconductor according to another exemplary embodiment of the present invention.
Figure 18:
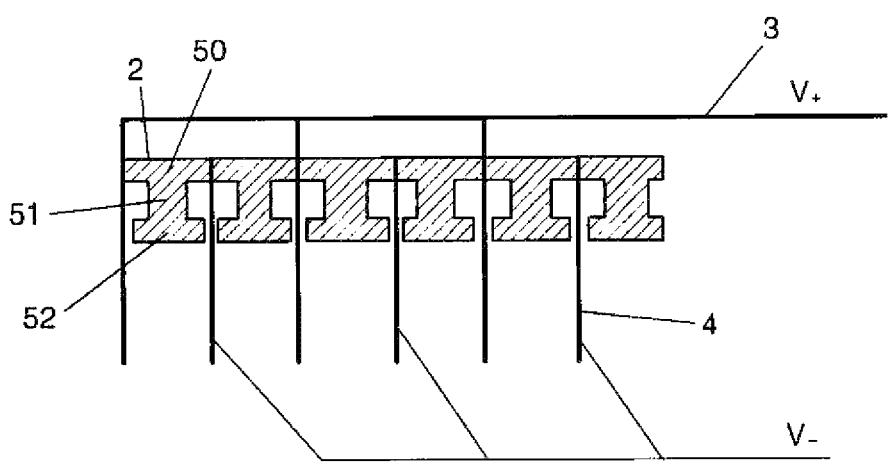

FIGS. 17 and 18 show a structure of the device for preventing the intensity reduction of the optical signal insulated between the positive electrode plate 3 and the negative electrode plate 4 by the nonconductor 2 and the insulator may be interposed between the positive electrode plates and the negative electrode plates which are alternately arranged.

In this case, since the collected charging particles are piled up on the surface of the nonconductor such that the insulation between the electrodes may be broken, the nonconductor may be formed in various structures for preventing this and preferably, as shown in FIGS. 17 and 18, the structure of the nonconductor may be configured by an insulation part 50 inserted between the positive electrode plate and the negative electrode plate, an anti-contamination part 52 formed to be spaced apart from the positive electrode plate and the negative electrode plate with a constant interval, and a connection part 51 connecting the insulation part 50 and the anti-contamination part 52.

The device for preventing the intensity reduction of the optical signal described above may be used for various optical techniques or contact measuring techniques which measure the optical signal or analyzed gas.

Figure 19:
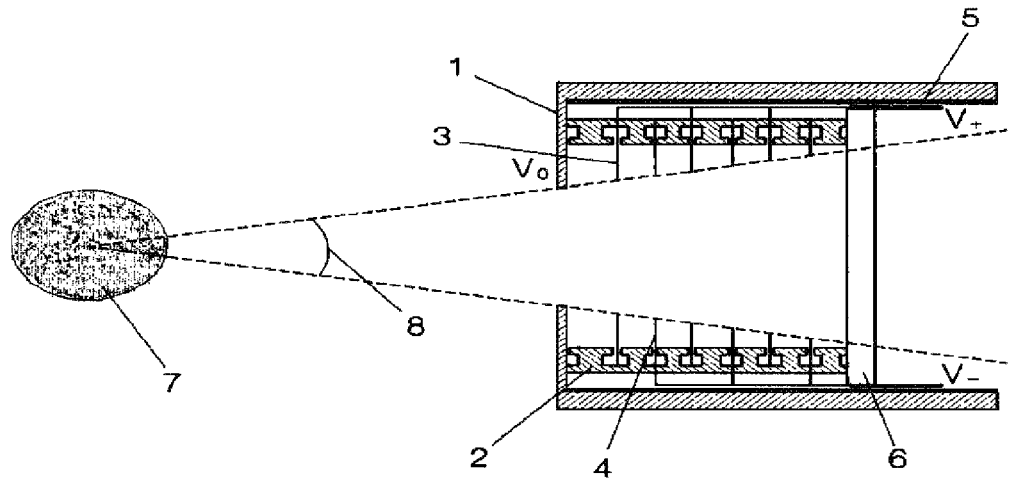
FIGS. 19 and 20 are cross-sectional views of an optical emission spectrometer according to another exemplary embodiment of the present invention.
Figure 20:
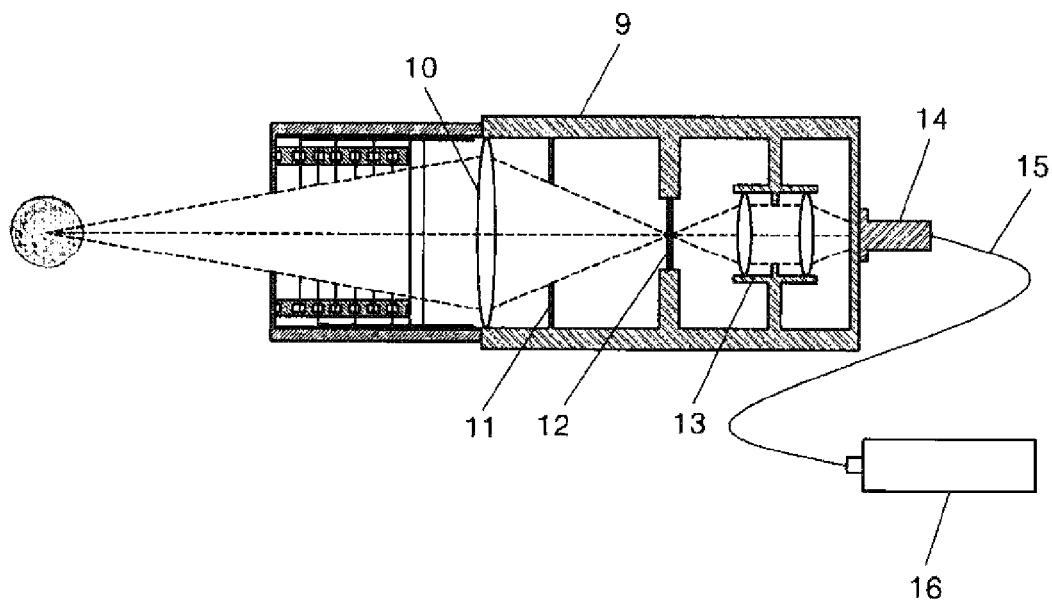

FIGS. 19 and 20 show cross-sectional views of the optical emission spectrometer to which the device for preventing the intensity reduction of the optical signal is applied. The optical emission spectrometer is configured by a plurality of positive electrode plates 3 and negative electrode plates 4 which have concentric holes formed at the center and are alternately arranged so as to overlap with each other. In addition, the optical emission spectrometer includes the device for preventing the intensity reduction of the optical signal which collects the charging particles passing through the holes, an optical system body including a receiving lens 10 into which the optical signal passing through the device for preventing the intensity reduction of the optical signal flows, a pinhole 12 on which an image of the optical signal passing through the receiving lens is focused, an aperture 11 installed between the pinhole and the receiving lens to determine a receiving angle, and a transfer optical system 13 transferring the optical signal passing through the pinhole, an optical fiber 15 transferring the optical signal passing through the optical system body to the analyzer, and a spectrum analyzer 16 analyzing the optical signal collected through the optical fiber.

In this case, the device for preventing the intensity reduction of the optical signal is attached and used to the front of the optical emission spectrometer for collecting the light generated from a measured target 7 of plasma and the like. The light radiated from the observed target such as plasma and the like focuses the image on the pinhole 12 by the receiving lens 10 of the optical emission spectrometer via the device for preventing the intensity reduction of the optical signal and the light passing through the pinhole is inputted into the optical fiber connection device 14 through the transfer optical system 13 to pass through the optical fiber 15 and finally, be inputted to the spectrum analyzer 16.

Sizes of inner concentric circles formed at the positive electrode plates and the negative electrode plates configuring the device for preventing the intensity reduction of the optical signal may be variously controlled according to a receiving angle of the light. Accordingly, it is possible to prevent the optical signal emitted from a portion other than the measuring portion from being inputted to the spectrometer and improve the signal-to-noise ratio when a predetermined portion is limited and a measurement having spatial resolution is performed.

In this case, each of the electrode plates configuring the device for preventing the intensity reduction of the optical signal may be fabricated by being black-colored or black-processed with a conductive material in order to prevent the scattering of light. In addition, when a lot of contamination particles are piled up in the anti-contamination device such that the replacement thereof is required, the whole device for preventing the intensity reduction of the optical signal is exchanged by forming separately a protection window in the front of the receiving lens, such that the contamination of the receiving part of the optical emission spectrometer may be prevented.

Meanwhile, when the device for preventing the intensity reduction of the optical signal is attached to the front of the optical emission spectrometer, since a viewing angle of the optical emission spectrometer is limited, it is difficult to align the device. Accordingly, in order to solve the problem, the laser device from which the laser light is outputted may be connected to the optical fiber.

If the laser light from the laser device is inputted through the fiber and the fiber connector, the laser light is emitted to the front of the optical emission spectrometer to be collected at one point of a position measuring the plasma. In this case, the optical emission spectrometer may be aligned by matching a collected position of the laser light emitted through the optical emission spectrometer and a position of a measuring target.

Figure 21:
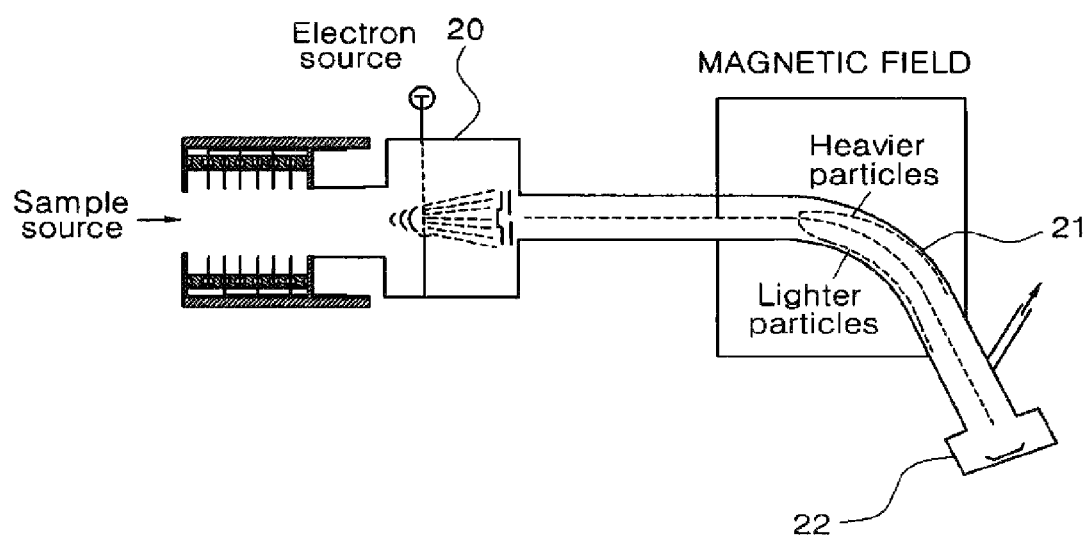
FIG. 21 is a cross-sectional view of a mass spectrometer according to another exemplary embodiment of the present invention.

FIG. 21 shows a cross-sectional view of a mass spectrometer to which the device for preventing the intensity reduction of the optical signal is applied. The mass spectrometer is configured by a plurality of positive electrode plates and negative electrode plates which have concentric holes formed at the center thereof and are alternately arranged so as to overlap with each other. In addition, the mass spectrometer includes a device for preventing the intensity reduction of an optical signal of an analyzing sample collecting the charging particles passing through the holes, an ionizer ionizing and accelerating the analyzing sample, a separator separating the accelerating ions according to a mass, and a detector detecting and measuring the separated ions. The anti-contamination device is attached and used to the front of the mass spectrometer into which the analyzed gas flows.

If the charging particles generated from the processing plasma are absorbed to the detector in a process of absorbing the analyzed gas which is a mass spectrometric target, performance of the detector may be deteriorated. Accordingly, like the optical emission spectrometer, the analyzed gas passes through the concentric holes of the electrode plates to collect the charging particles in the analyzed gas, such that it is possible to prevent the contamination of the gas analyzer.

Further, when the gas is collected in the plasma process to analyze the process, the device for preventing the intensity reduction of the optical signal removes the ion molecules included in the gas and absorbed to the device, such that it is possible to improve the reliability of the measurement and prevent the contamination of the device.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A device for preventing the intensity reduction of an optical signal, the device comprising:
   a plurality of positive electrode plates and negative electrode plates having, concentric holes formed at the center thereof and alternately arranged so as to overlap with each other to collect charging particles passing through the holes, wherein the positive electrode plate and the negative electrode plate are insulated from each other by a nonconductor, and wherein the nonconductor is configured to prevent the positive electrode plate and the negative electrode plate from being current-conducted with each other by the contamination of the nonconductor surface due to the charging particles, and comprises:

an insulation, part inserted between the positive electrode plate and the negative electrode plate;

an anti-contamination part formed to be spaced apart from the positive electrode plate and the negative electrode plate with a regular interval; and a connection part connecting the insulation part and the anti-contamination part.

2. The device of claim 1, wherein the electrode plate array is insulated from an external body by the nonconductor.

\* \* \* \* \*